United States Patent
Yu

(10) Patent No.: US 6,399,469 B1
(45) Date of Patent: Jun. 4, 2002

(54) FABRICATION OF A NOTCHED GATE STRUCTURE FOR A FIELD EFFECT TRANSISTOR USING A SINGLE PATTERNING AND ETCH PROCESS

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/613,087

(22) Filed: Jul. 10, 2000

(51) Int. Cl.[7] ........................................... H01L 21/3205
(52) U.S. Cl. ........................ 438/595; 438/591; 438/669; 438/738
(58) Field of Search ................................. 438/595, 591, 438/936, 658, 659, 657, 669, 737, 738, 720

(56) References Cited

U.S. PATENT DOCUMENTS 5,559,049 A * 9/1996 Cho
5,998,289 A * 12/1999 Sagnes

* cited by examiner

Primary Examiner—Caridad Everhart
(74) Attorney, Agent, or Firm—Monica H. Choi

(57) ABSTRACT

For fabricating a field effect transistor within an active device area of a semiconductor substrate, a first semiconductor layer of a first semiconductor material is deposited on a gate dielectric layer, and a second semiconductor layer of a second semiconductor material is deposited on the first semiconductor layer. A photoresist layer is deposited and patterned on the second semiconductor layer to form a gate photoresist structure on the second semiconductor layer. The gate photoresist structure is disposed over the active device area of the semiconductor substrate. Exposed regions of the second semiconductor layer, the first semiconductor layer, and the gate dielectric layer are etched continuously using a predetermined etch process to form a first gate structure from etching of the first semiconductor layer, a second gate structure from etching of the second semiconductor layer, and a gate dielectric from etching of the gate dielectric layer. A first etch rate of the first semiconductor material in the predetermined etch process is faster than in, a second etch rate of the second semiconductor material in the predetermined etch process such that a first length of the first gate structure and the gate electric is smaller than a second length of the second gate structure after the predetermined etch process. Thus, the first gate structure and the second gate structure form a notched gate structure of the field effect transistor for minimizing the overlap of the gate dielectric over the drain and source extensions of the field effect transistor to enhance the speed performance of the field effect transistor.

14 Claims, 3 Drawing Sheets

FABRICATION OF A NOTCHED GATE STRUCTURE FOR A FIELD EFFECT TRANSISTOR USING A SINGLE PATTERNING AND ETCH PROCESS

TECHNICAL FIELD

The present invention relates generally to fabrication of field effect transistors having scaled-down dimensions, and more particularly, to fabrication of a field effect transistor with a notched gate structure by depositing multiple semiconductor layers having different etch rates such that a single patterning and etch process forms the notched gate structure.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension 104 and a source extension 106 formed within an active device area 126 of the semiconductor substrate 102. The drain extension 104 and the source extension 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where the MOSFET 100 is fabricated therein.

The MOSFET 100 also includes a spacer 122 disposed on the sidewalls of the gate electrode 118 and the gate dielectric 116. When the spacer 122 is comprised of silicon nitride (SiN), then a spacer liner oxide 124 is deposited as a buffer layer between the spacer 122 and the sidewalls of the gate electrode 118 and the gate dielectric 116.

As the dimensions of the MOSFET 100 are scaled down to tens of nanometers, the parasitic capacitance from the overlap of the gate dielectric 116 over the drain extension 104 and the source extension 106 (i.e., the "Miller capacitance) becomes significant in limiting the speed performance of the MOSFET 100, as known to one of ordinary skill in the art of electronics. Thus, a mechanism is desired for minimizing the overlap of the gate dielectric over the drain extension and the source extension in a MOSFET having scaled down dimensions of tens of nanometers.

SUMMARY OF THE INVENTION

Accordingly, in a general aspect of the present invention, a notched gate structure is formed with a first gate structure disposed below a second gate structure. The first gate structure is formed to have a smaller length than that of the second gate structure, and the gate dielectric is formed to have the smaller length of the first gate structure to minimize the overlap of the gate dielectric over the drain and source extensions of the MOSFET. In addition, multiple semiconductor layers having different etch rates are deposited for forming the first and second gate structures such that a single patterning and etch process forms the notched gate structure.

In one embodiment of the present invention, for fabricating a field effect transistor within an active device area of a semiconductor substrate, a gate dielectric layer is deposited on the semiconductor substrate. A first semiconductor layer of a first semiconductor material is deposited on the gate dielectric layer, and a second semiconductor layer of a second semiconductor material is deposited on the first semiconductor layer. A photoresist layer is deposited and patterned on the second semiconductor layer to form a gate photoresist structure on the second semiconductor layer. The gate photoresist structure is disposed over the active device area of the semiconductor substrate. Exposed regions of the second semiconductor layer and the first semiconductor layer are etched continuously using a predetermined etch process to form a first gate structure from etching of the first semiconductor layer and to form a second gate structure from etching of the second semiconductor layer. The second gate structure is disposed on the first gate structure.

The first semiconductor material is different from the second semiconductor material. A first etch rate of the first semiconductor material in the predetermined etch process is faster than a second etch rate of the second semiconductor material in the predetermined etch process such that a first length of the first gate structure is smaller than a second length of the second gate structure after the predetermined etch process. Thus, the sidewalls of the first gate structure are disposed inward from the sidewalls of the second gate structure by a predetermined notch distance such that the first gate structure and the second gate structure form a notched gate structure of the field effect transistor.

The present invention may be used to particular advantage when the first semiconductor material is comprised of polysilicon and germanium with a germanium content in a range of from about 30% to about 50%, and when the second semiconductor material is comprised of polysilicon. In that case, the content of germanium in the first semiconductor layer may be raised to increase the predetermined notch distance since a higher content of germanium in the first semiconductor layer increases the first etch rate of the first semiconductor layer. Furthermore, the thickness of the first semiconductor layer may be raised to increase the predetermined notch distance since a longer time for etching a thicker first semiconductor layer also further etches the first semiconductor layer laterally.

In another aspect of the present invention, exposed regions of the gate dielectric layer are etched to form a gate dielectric under the first gate structure such that the gate dielectric has the first length of the first gate structure. A drain extension junction and a source extension junction are formed by implanting an extension dopant in exposed regions of the active device area of the semiconductor substrate.

The extension dopant during the implant is directed vertically perpendicular to the semiconductor substrate with the second gate structure blocking the extension dopant such that the drain extension junction and the source extension junction do not extend under the gate dielectric after the implant. A RTA (rapid thermal anneal) is performed to active the extension dopant in the drain extension junction and the source extension junction. The extension dopant in the drain extension junction and the source extension junction thermally diffuses during the RTA (rapid thermal anneal) such that the drain extension junction and the source extension extend under the gate dielectric after the RTA (rapid thermal anneal).

In this manner, the overlap of the gate dielectric over the drain and source extensions is minimized to in turn minimize the Miller parasitic capacitance of the field effect transistor such that the speed performance of the field effect transistor is enhanced. In addition, multiple semiconductor layers having different etch rates are deposited for forming the first and second gate structures such that a single patterning and etch process forms the notched gate structure.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, and 9 refer to elements having similar structure and function.

DETAILED DESCRIPTION

Figure 1:
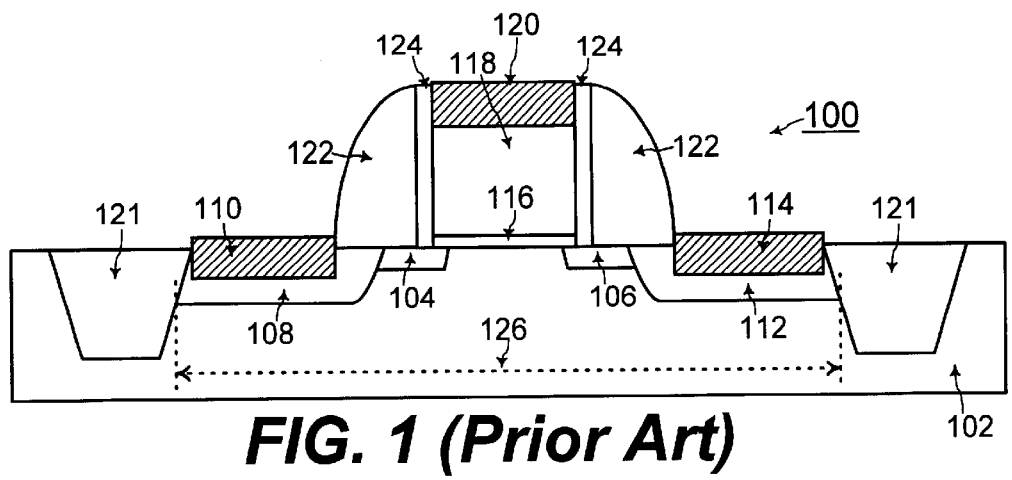
FIG. 1 shows a cross-sectional view of a conventional MOSFET (Metal Oxide Semiconductor Field Effect Transistor) having a conventional gate structure with a gate dielectric that significantly overlaps the drain and source extension junctions of the MOSFET.
Figure 2:
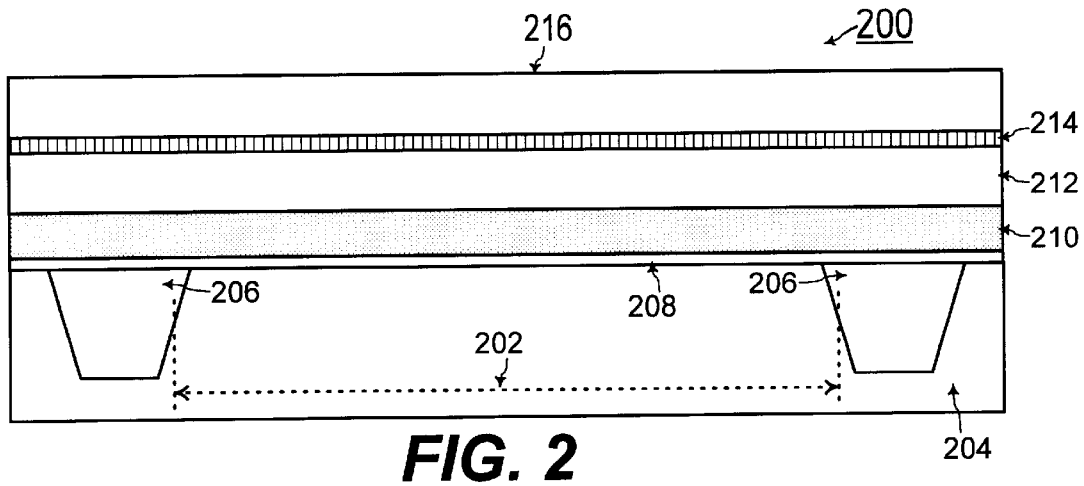
FIGS. 2, 3, 4, 5, 6, 7, 8, and 9 show cross-sectional views for illustrating the steps for fabricating a MOSFET (Metal Oxide Semiconductor Field Effect Transistor) with a notched gate structure to minimize the overlap of the gate dielectric over the drain and source extension junctions such that the speed performance of the field effect transistor is enhanced, according to an embodiment of the present invention. In addition, multiple semiconductor layers having different etch rates are deposited for forming the first and second gate structures such that a single patterning and etch process forms the notched gate structure.

Referring to FIG. 2, a MOSFET (Metal Oxide Semiconductor Field Effect Transistor) 200 is to be fabricated within an active device area 202 of a semiconductor substrate 204 defined by shallow trench isolation structures 206. Processes for formation of shallow trench isolation structures for electrically isolating integrated circuit devices within a semiconductor substrate are known to one of ordinary skill in the art of integrated circuit fabrication.

For formation of a gate structure of the MOSFET 200, a gate dielectric layer 208 is deposited on the semiconductor substrate 204. The gate dielectric layer 208 may be comprised of silicon dioxide ($SiO_2$). In that case, the thickness of the gate dielectric layer 208 is in a range of from about 15 Å (angstroms) to about 25 Å (angstroms) for the MOSFET 200 having scaled down dimensions of tens of nanometers.

Alternatively, the gate dielectric layer 208 may be comprised of a dielectric material having a dielectric constant that is higher than the dielectric constant of silicon dioxide ($SiO_2$), such as metal oxides (i.e., aluminum oxide ($Al_2O_3$), titanium dioxide ($TiO_2$), or tantalum oxide ($Ta_2O_5$), for example). When the gate dielectric layer 208 is comprised of such dielectric material with high dielectric constant, the gate dielectric layer 208 has higher thickness to advantageously minimize charge carrier tunneling through the gate dielectric of the MOSFET 200, as known to one of ordinary skill in the art of integrated circuit fabrication. Processes for deposition of such dielectric material are known to one of ordinary skill in the art of integrated circuit fabrication.

Further referring to FIG. 2, a first semiconductor layer 210 comprised of a first semiconductor material is deposited on the gate dielectric layer 208. In one embodiment of the present invention, the first semiconductor layer 210 is comprised of polysilicon and germanium with a germanium content in the polysilicon being in a range of from about 30% to about 50%. Processes, such a LPCVD (liquid phase chemical vapor deposition), for deposition of such a semiconductor material for the first semiconductor layer 210 are known to one of ordinary skill in the art of integrated circuit fabrication.

Further referring to FIG. 2, a second semiconductor layer 212 comprised of a second semiconductor material is deposited on the first semiconductor layer 210. In one embodiment of the present invention, the second semiconductor layer 212 is comprised of polysilicon when the first semiconductor layer 210 is comprised of polysilicon and germanium. Processes, such a LPCVD (liquid phase chemical vapor deposition), for deposition of such a semiconductor material for the second semiconductor layer 212 are known to one of ordinary skill in the art of integrated circuit fabrication. In one embodiment of the present invention, the first semiconductor layer 210 and the second semiconductor layer 212 are deposited in the same LPCVD (liquid phase chemical vapor deposition) chamber by turning on a germanium reactant source for formation of the first semiconductor layer 210 comprised of polysilicon and germanium and by turning off the germanium reactant source for formation of the second semiconductor layer 212 comprised of polysilicon.

Referring to FIG. 2, in a preferred embodiment of the present invention, an anti-reflective capping layer 214 of silicon oxynitride (SiON) having a thickness in a range of from about 150 Å (angstroms) to about 250 Å (angstroms) is deposited on the second semiconductor layer 212 before a photoresist layer 216 is deposited on the anti-reflective capping layer 214. The anti-reflective capping layer 214 is relatively non-reflective of photon beams used during patterning of the photoresist layer 216 such that the photoresist layer 216 may be patterned more accurately during a photolithography process, as known to one of ordinary skill in the art of integrated circuit fabrication.

Figure 3:
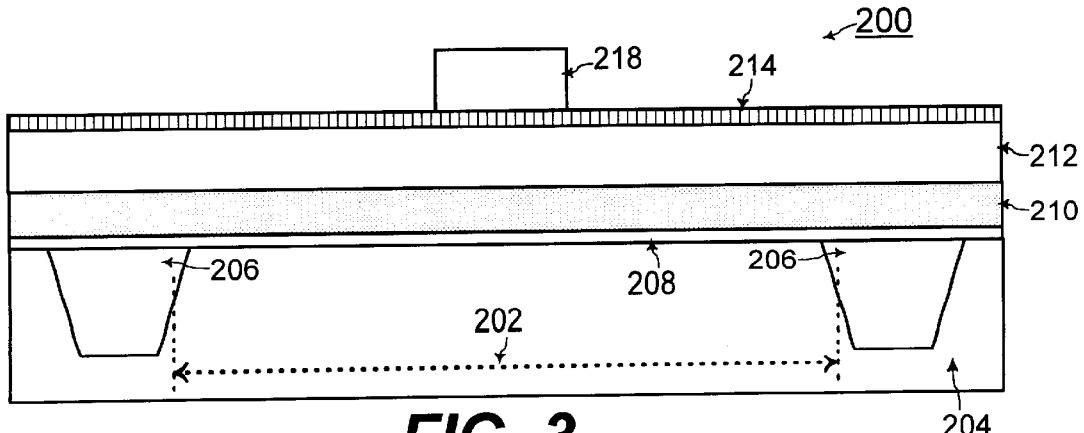

Referring to FIGS. 2 and 3, the photoresist layer 216 is patterned and etched to form a gate photoresist structure 218 on the anti-reflective capping layer 214. The gate photoresist structure 218 is formed to be over the active device area 202 of the semiconductor substrate 204. Processes for patterning and etching the photoresist layer 216 to form the gate photoresist structure 218 are known to one of ordinary skill in the art of integrated circuit fabrication.

Figure 4:
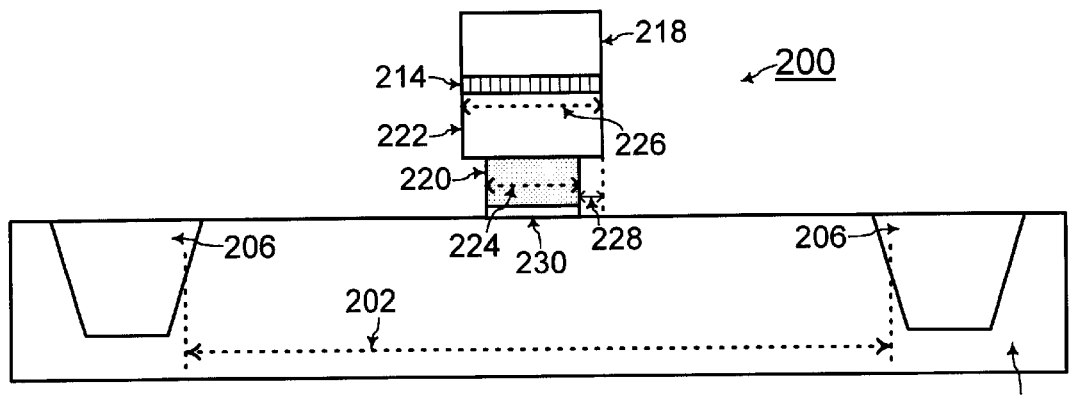

Referring to FIGS. 3 and 4, exposed regions of the anti-reflective capping layer 214, the second semiconductor layer 212, and the first semiconductor layer 210 are etched continuously using a predetermined etch process. The predetermined etch process, for example, may be a dry plasma etch process that is an isotropic etch, and such etch processes for continuously etching the anti-reflective capping layer 214, the second semiconductor layer 212, and the first semiconductor layer 210 are known to one of ordinary skill in the art of integrated circuit fabrication.

The first semiconductor material of the first semiconductor layer 210 has a first etch rate in the predetermined etch process that is faster than a second etch rate of the second semiconductor material of the second semiconductor layer 212 in the predetermined etch process. For example, in one embodiment of the present invention, polysilicon and germanium of the first semiconductor layer 210 has a faster etch rate than the etch rate of polysilicon of the second semiconductor layer 212 in a dry plasma etch process.

A first gate structure 220 is formed from etching of the first semiconductor layer 210 in the predetermined etch process, and a second gate structure 222 is formed from etching of the second semiconductor layer 212 in the predetermined etch process. Because the first semiconductor layer 210 etches with a faster etch rate than the second semiconductor layer 212, a first length 224 of the first gate structure 220 is smaller than a second length 226 of the second gate structure 222 such that the sidewalls of the first gate structure 220 are disposed inward from the sidewalls of the second gate structure 222 by a predetermined notch distance 228. Thus, the first gate structure 220 and the second gate structure 222 form a notched gate structure of the MOSFET 200.

In one embodiment of the present invention, when the first semiconductor layer 210 is comprised of polysilicon and germanium and the second semiconductor layer 212 is comprised of polysilicon, the predetermined notch distance 228 is controlled by adjusting the content of germanium in the first semiconductor layer 210. The content of germanium in the first semiconductor layer 210 is raised to increase the predetermined notch distance 228 because a higher content of germanium in the first semiconductor layer 210 increases the first etch rate of the first semiconductor layer 210.

Furthermore, the predetermined notch distance 228 is controlled by adjusting the thickness of the first semiconductor layer 210. The thickness of the first semiconductor layer 210 is raised to increase the predetermined notch distance 228 because a longer time for etching a thicker first semiconductor layer 210 also further etches the first semiconductor layer 210 laterally. In one embodiment of the present invention, the first semiconductor layer 210 that is comprised of polysilicon and germanium has a thickness in a range of from about 300 Å (angstroms) to about 800 Å (angstroms), and the second semiconductor layer 212 that is comprised of polysilicon has a thickness in a range of from about 400 Å (angstroms) to about 2000 Å (angstroms).

Referring to FIGS. 3 and 4, any exposed region of the gate dielectric layer 208 is etched such that a gate dielectric 230 of the MOSFET 200 is formed under the first gate structure 220. The gate dielectric 230 has the first length 224 of the first gate structure 220. The gate dielectric layer 208 may be etched during the predetermined etch process for ink continuously etching the first semiconductor layer 210 and the second semiconductor layer 212. Alternatively, the gate dielectric 208 may be etched in a separate etch process after the first semiconductor layer 210 and the second semiconductor layer 212 are etched to form the first gate structure 220 and the second gate structure 222. Processes for etching the gate dielectric layer 208 which may be comprised of silicon dioxide ($SiO_2$) or a metal oxide having high dielectric constant are known to one of ordinary skill in the art of integrated circuit fabrication.

Figure 5:
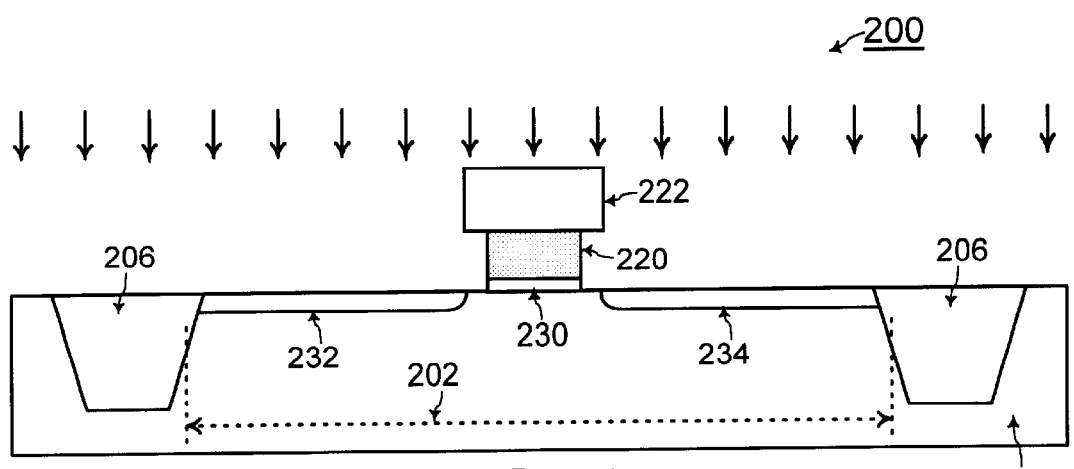

Referring to FIGS. 4 and 5, the gate photoresist structure 218 and the anti-reflective capping layer 214 are etched away such that the notched gate structure comprised of the first gate structure 220 and the second gate structure 222 remains. Referring to FIG. 5, an extension dopant is implanted into exposed regions of the active device area 202 to form a drain extension junction 232 and a source extension junction 234. The drain extension junction 232 and the source extension junction 234 are shallow junctions to minimize short-channel effects in the MOSFET 200 having nanometer dimensions, as known to one of ordinary skill in the art of integrated circuit fabrication.

The extension dopant is an N-type dopant for forming the drain extension junction 232 and the source extension junction 234 of an NMOSFET (N-channel Metal Oxide Semiconductor Field Effect Transistor). Alternatively, the extension dopant is a P-type dopant for forming the drain extension junction 232 and the source extension junction 234 of a PMOSFET (P-channel Metal Oxide Semiconductor Field Effect Transistor). Processes for implantation of the extension dopant for formation of the drain extension junction 232 and the source extension junction 234 are known to one of ordinary skill in the art of integrated circuit fabrication.

Referring to FIG. 5, in one embodiment of the present invention, the extension dopant is directed toward the semiconductor substrate 204 vertically perpendicular to the semiconductor substrate 204. The second gate structure 222 which has a larger length than the length of the first gate structure 220 and the gate dielectric 230 blocks the extension dopant from the semiconductor substrate 204. Thus, the drain extension junction 232 and the source extension junction 234 do not extend under the gate dielectric 230 after the implantation of the extension dopant into the semiconductor substrate 204.

Figure 6:
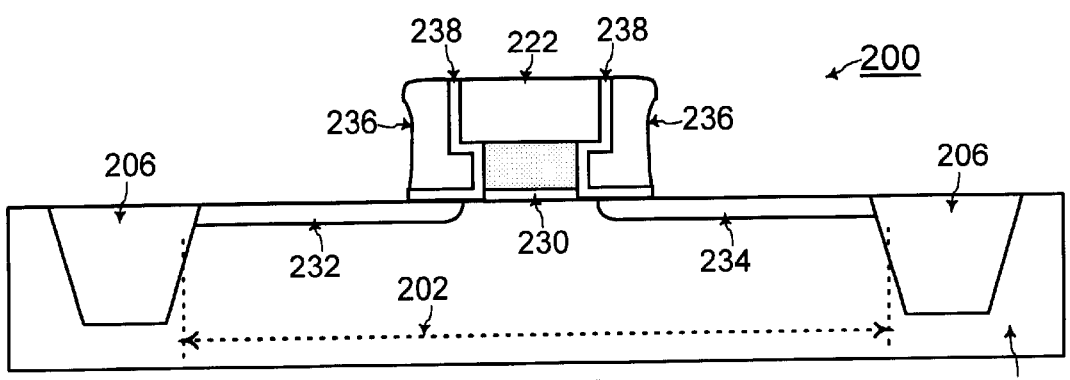

Referring to FIGS. 5 and 6, spacers 236 are formed on sidewalls of the gate dielectric 230, the first gate structure 220, and the second gate structure 222. In one embodiment of the present invention, the spacers 236 may be comprised of silicon dioxide ($SiO_2$) or silicon nitride ($Si_3N_4$) having a width in a range of from about 400 Å (angstroms) to about 600 Å (angstroms). When the spacers 236 are comprised of silicon nitride ($Si_3N_4$), a liner oxide 238 having a thickness in a range of from about 100Å (angstroms) to about 150 Å (angstroms) is formed between the spacers 236 and the sidewalls of the gate dielectric 230, the first gate structure 220, and the second gate structure 222, and between the spacers 236 and the semiconductor substrate 204. Processes for formation of the spacers 236 and the liner oxide 238 are known to one of ordinary skill in the art of integrated circuit fabrication.

Figure 7:
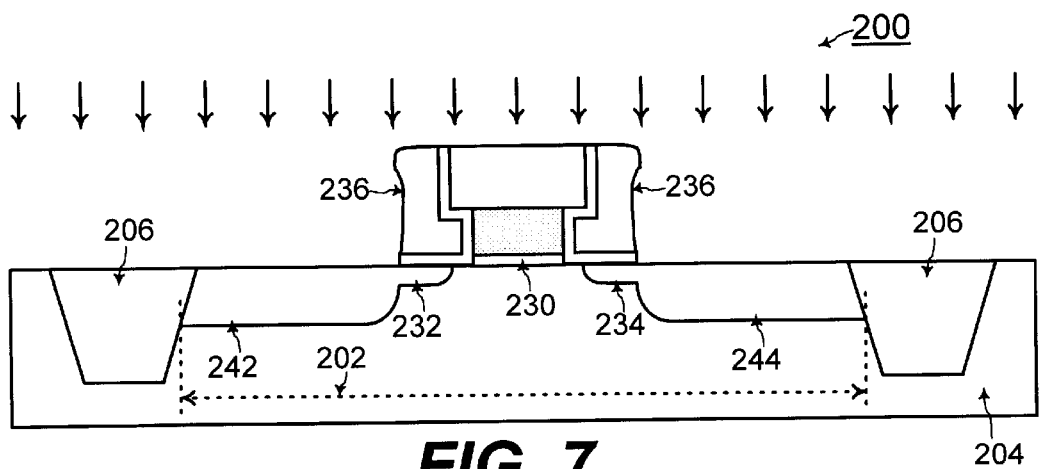

Referring to FIG. 7, after formation of the spacers 236, a contact dopant is implanted into exposed regions of the active device area 202 to form a drain contact junction 242 and a source contact junction 244. The drain contact junction 242 and the source contact junction 244 are deep junctions such that a relatively large volume of silicide may be fabricated therein to provide low resistance contact to the drain and the source of the MOSFET 200, as known to one of ordinary skill in the art of integrated circuit fabrication.

The contact dopant is an N-type dopant for forming the drain contact junction 242 and the source contact junction 244 of an NMOSFET (N-channel Metal Oxide Semiconductor Field Effect Transistor). Alternatively, the contact dopant is a P-type dopant for forming the drain contact junction 242 and the source contact junction 244 of a PMOSFET (P-channel Metal Oxide Semiconductor Field Effect Transistor). Processes for implantation of the contact dopant for formation of the drain contact junction 242 and the source contact junction 244 are known to one of ordinary skill in the art of integrated circuit fabrication.

Figure 8:
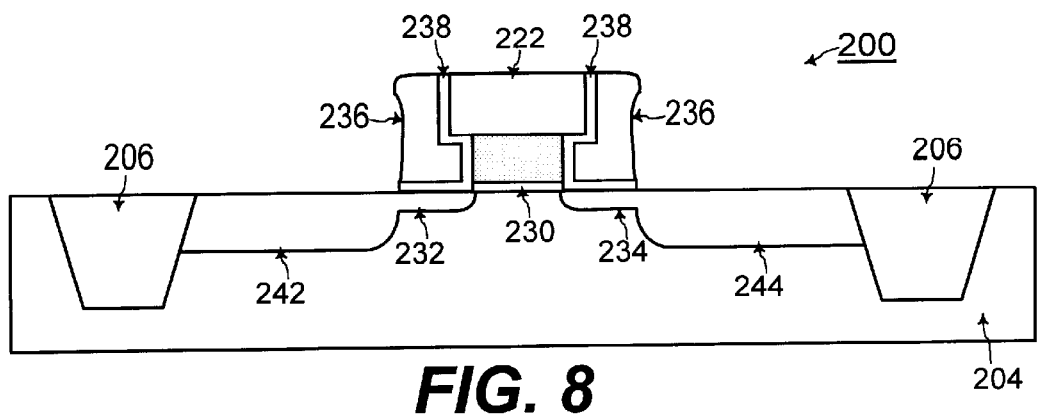

In FIGS. 5, 6, and 7, the drain extension junction 232 and the source extension junction 234 do not extend under the gate dielectric 230 because the second gate structure 222 blocked the extension dopant from reaching the semiconductor substrate 204 during implantation of the extension dopant. Referring to FIG. 8, a RTA (rapid thermal anneal) is performed to activate the dopant within the drain extension junction 232, the drain contact as junction 242, the source extension junction 234, and the source contact junction 244. RTA (rapid thermal anneal) processes are known to one of ordinary skill in the art of integrated circuit fabrication.

During the RTA (rapid thermal anneal), the extension dopant within the drain extension junction 232 and the source extension junction 234 thermally diffuses toward the channel of the MOSFET 200 under the gate dielectric 230. Thus, in FIG. 8, after the RTA (rapid thermal anneal), the drain extension junction 232 and the source extension junction 234 extend under the gate dielectric 230 for proper operation of the MOSFET 200. However, referring to FIGS. 4 and 5, because the drain extension junction 232 and the source extension junction 234 are disposed away from the gate dielectric 230 by the predetermined notch distance 228 after the implantation of the extension dopant, the overlap of the gate dielectric 230 over the drain extension junction 232 and the source extension junction 234 is minimized.

In this manner, because the overlap of the gate dielectric 230 over the drain extension junction 232 and the source extension junction 234 is minimized, the parasitic Miller capacitance is minimized such that the speed performance of the MOSFET 200 is enhanced. In addition, by etching the first semiconductor layer 210 having a faster etch rate than the second semiconductor layer 212 for formation of the first gate structure 220 and second gate structure 222, the notched gate structure of the MOSFET 200 is formed using a single patterning and etch process.

Figure 9:
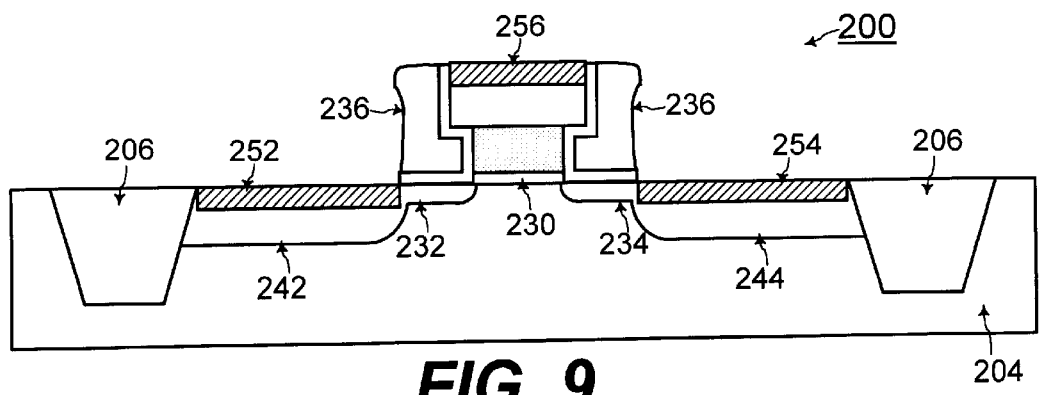

Referring to FIG. 9, a drain silicide 252 is formed with the drain contact junction 242 for providing contact to the drain of the MOSFET 200, and a source silicide 254 is formed with the source contact junction 244 for providing contact to the source of the MOSFET 200. A gate silicide 256 is formed with the second gate structure 222 for providing contact to the gate of the MOSFET 200. Such silicides may be comprised of one of cobalt silicide ($CoSi_2$) or titanium silicide ($TiSi_2$) for example, and processes for formation of such silicides are known to one of ordinary skill in the art of integrated circuit fabrication.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "top," "sidewall," "over," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:
1. A method for fabricating a field effect transistor within an active device area of a semiconductor substrate, the method including the steps of:
   A. depositing a gate dielectric layer on said semiconductor substrate;
   B. depositing a first semiconductor layer on said gate dielectric layer, said first semiconductor layer being comprised of a first semiconductor material;
   C. depositing a second semiconductor layer on said first semiconductor layer, said second semiconductor layer being comprised of a second semiconductor material;
   D. patterning a photoresist layer deposited on said second semiconductor layer to form a gate photoresist structure on said second semiconductor layer, wherein said gate photoresist structure is disposed over said active device area of said semiconductor substrate; and
   E. etching exposed regions of said second semiconductor layer and said first semiconductor layer continuously using a predetermined etch process to form a first gate structure from etching of said first semiconductor layer and to form a second gate structure from etching of said second semiconductor layer, wherein said second gate structure is disposed on said first gate structure;
   and wherein said first semiconductor material is different from said second semiconductor material,
   and wherein a first etch rate of said first semiconductor material in said predetermined etch process is faster than a second etch rate of said second semiconductor material in said predetermined etch process such that a first length of said first gate structure is smaller than a second length of said second gate structure after said predetermined etch process,
   and wherein sidewalls of said first gate structure are disposed inward from sidewalls of said second gate structure by a predetermined notch distance such that said first gate structure and said second gate structure form a notched gate structure of said field effect transistor;
   and wherein said first semiconductor material is comprised of polysilicon and germanium with a germanium content in a range of from about 30% to about 50%, and wherein said second semiconductor material is comprised of polysilicon.

2. The method of claim 1, wherein said first semiconductor layer of polysilicon and germanium has a thickness in a range of from about 300 Å (angstroms) to about 800 Å (angstroms), and wherein said second semiconductor layer of polysilicon has a thickness in a range of from about 400 Å (angstroms) to about 2000 Å (angstroms).

3. The method of claim 1, further including the step of:
   increasing a content of germanium in said first semiconductor layer to increase said predetermined notch distance.

4. The method of claim 1, further including the step of:
   increasing a thickness of said first semiconductor layer to increase said predetermined notch distance.

5. A method for fabricating a field effect transistor within an active device area of a semiconductor substrate, the method including the steps of:

A. depositing a gate dielectric layer on said semiconductor substrate;

B. depositing a first semiconductor layer on said gate dielectric layer, said first semiconductor layer being comprised of a first semiconductor material;

C. depositing a second semiconductor layer on said first semiconductor layer, said second semiconductor layer being comprised of a second semiconductor material;

D. patterning a photoresist layer deposited on said second semiconductor layer to form a gate photoresist structure on said second semiconductor layer, wherein said gate photoresist structure is disposed over said active device area of said semiconductor substrate;

E. etching exposed regions of said second semiconductor layer and said first semiconductor layer continuously using a predetermined etch process to form a first gate structure from etching of said first semiconductor layer and to form a second gate structure from etching of said second semiconductor layer, wherein said second gate structure is disposed on said first gate structure;

and wherein said first semiconductor material is different from said second semiconductor material, and wherein a first etch rate of said first semiconductor material in said predetermined etch process is faster than a second etch rate of said second semiconductor material in said predetermined etch process such that a first length of said first gate structure is smaller than a second length of said second gate structure after said predetermined etch process, and wherein sidewalls of said first gate structure are disposed inward from sidewalls of said second gate structure by a predetermined notch distance such that said first gate structure and said second gate structure form a notched gate structure of said field effect transistor;

F. etching exposed regions of said gate dielectric layer to form a gate dielectric under said first gate structure such that said gate dielectric has said first length of said first gate structure;

G. forming a drain extension junction and a source extension junction by implanting an extension dopant in exposed regions of said active device area of said semiconductor substrate;

H. forming spacers on sidewalls of said gate dielectric, said first gate structure, and said second gate structure;

I. forming a drain contact junction and a source contact junction by implanting a contact dopant in exposed regions of said active device area of said semiconductor substrate; and J. forming a drain silicide with said drain contact junction, a source silicide with said source contact junction, and a gate silicide with said second gate structure.

6. The method of claim 5, wherein said extension dopant during said implant is directed vertically perpendicular to said semiconductor substrate with said second gate structure blocking said extension dopant such that said drain extension junction and said source extension junction do not extend under said gate dielectric after said implant.

7. The method of claim 6, further including the step of:

performing a RTA (rapid thermal anneal) to active said extension dopant in said drain extension junction and said source extension junction, wherein said extension dopant in said drain extension junction and said source extension junction thermally diffuses during said RTA (rapid thermal anneal) such that said drain extension junction and said source extension extend under said gate dielectric after said RTA (rapid thermal anneal).

8. The method of claim 5, wherein said spacers are comprised of silicon nitride ($Si_3N_4$), and wherein the method further includes the step of:

forming a liner oxide between said spacers and said sidewalls of said gate dielectric, said first gate structure, and said second gate structure, and between said spacers and said semiconductor substrate.

9. The method of claim 5, wherein said first semiconductor material is comprised of polysilicon and germanium with a germanium content in a range of from about 30% to about 50%, and wherein said second semiconductor material is comprised of polysilicon.

10. The method of claim 9, wherein said first semiconductor layer of polysilicon and germanium has a thickness in a range of from about 300 Å (angstroms) to about 800 Å (angstroms), and wherein said second semiconductor layer of polysilicon has a thickness in a range of from about 400 Å (angstroms) to about 2000 Å (angstroms).

11. The method of claim 9, further including the step of:

increasing a content of germanium in said first semiconductor layer to increase said predetermined notch distance.

12. The method of claim 9, further including the step of:

increasing a thickness of said first semiconductor layer to increase said predetermined notch distance.

13. The method of claim 5, further including the step of:

depositing an anti-reflective capping layer of silicon oxynitride (SiON) on said second semiconductor layer before depositing and patterning said photoresist layer on said anti-reflective capping layer.

14. A method for fabricating a MOSFET (metal oxide semiconductor field effect transistor) within an active device area of a semiconductor substrate, the method including the steps of:

depositing a gate dielectric layer on said semiconductor substrate;

depositing a first semiconductor layer comprised of polysilicon and germanium with a germanium content in a range of from about 30% to about 50% on said gate dielectric layer, wherein said first semiconductor layer has a thickness in a range of from about 300 Å (angstroms) to about 800 Å (angstroms);

depositing a second semiconductor layer comprised of polysilicon on said first semiconductor layer, wherein said second semiconductor layer of polysilicon has a thickness in a range of from about 400 Å (angstroms) to about 2000 Å (angstroms);

depositing an anti-reflective capping layer of silicon oxynitride (SiON) on said second semiconductor layer, patterning a photoresist layer deposited on said anti-reflective capping layer to form a gate photoresist structure on said anti-reflective capping layer, wherein said gate photoresist structure is disposed over said active device area of said semiconductor substrate;

etching exposed regions of said anti-reflective capping layer, said second semiconductor layer, and said first semiconductor layer continuously using a predetermined etch process to form a first gate structure from etching of said first semiconductor layer and to form a second gate structure from etching of said second semiconductor layer, wherein said second gate structure is disposed on said first gate structure, and wherein said predetermined etch process is a dry plasma etch process;

and wherein a first etch rate of said first semiconductor material in said predetermined etch process is faster than a second etch rate of said second semiconductor material in said predetermined etch process such that a first length of said first gate structure is smaller than a second length of said second gate structure after said predetermined etch process, and wherein sidewalls of said first gate structure are disposed inward from sidewalls of said second gate structure by a predetermined notch distance such that said first gate structure and said second gate structure form a notched gate structure of said MOSFET;

increasing a content of germanium in said first semiconductor layer to increase said predetermined notch distance;

increasing a thickness of said first semiconductor layer to increase said predetermined notch distance;

etching exposed regions of said gate dielectric layer to form a gate dielectric under said first gate structure such that said gate dielectric has said first length of said first gate structure;

forming a drain extension junction and a source extension junction by implanting an extension dopant in exposed regions of said active device area of said semiconductor substrate;

forming spacers on sidewalls of said gate dielectric, said first gate structure, and said second gate structure;

forming a drain contact junction and a source contact junction by implanting a contact dopant in exposed regions of said active device area of said semiconductor substrate;

forming a drain silicide with said drain contact junction, a source silicide with said source contact junction, and a gate silicide with said second gate structure;

wherein said extension dopant during said implant is directed vertically perpendicular to said semiconductor substrate with said second gate structure blocking said extension dopant such that said drain extension junction and said source extension junction do not extend under said gate dielectric after said implant;

performing a RTA (rapid thermal anneal) to active said extension dopant in said drain extension junction and said source extension junction, wherein said extension dopant in said drain extension junction and said source extension junction thermally diffuses during said RTA (rapid thermal anneal) such that said drain extension junction and said source extension extend under said gate dielectric after said RTA (rapid thermal anneal); and forming a liner oxide between said spacers and said sidewalls of said gate dielectric, said first gate structure, and said second gate structure, and between said spacers and said semiconductor substrate when said spacers are comprised of silicon nitride ($Si_3N_4$).

* * * * *